US005625648A

United States Patent [19]

Hedberg

[11] Patent Number: 5,625,648

[45] Date of Patent: Apr. 29, 1997

[54] SIGNAL RECEIVING AND SIGNAL PROCESSING UNIT

[75] Inventor: Mats O. J. Hedberg, Haninge, Sweden

[73] Assignee: Telefonaktiebolaget LM Ericsson, Stockholm, Sweden

[21] Appl. No.: 407,626

[22] Filed: Mar. 21, 1995

[30] Foreign Application Priority Data

Mar. 23, 1994 [SE] Sweden ................................ 94 00971

[51] Int. Cl.[6] ......................... H03K 9/00; H03K 17/687; H03K 17/60

[52] U.S. Cl. ......................... 375/316; 327/437; 327/490; 327/391; 323/315

[58] Field of Search .................................... 375/257, 316, 375/259; 327/51, 52, 53, 108, 389, 391, 374, 427, 437, 432, 463, 490; 323/315, 316

[56] References Cited

U.S. PATENT DOCUMENTS

| | | | |
|---|---|---|---|
| 5,028,811 | 7/1991 | Le Roux et al. | 327/427 |
| 5,568,082 | 10/1996 | Hedberg | 327/437 |

FOREIGN PATENT DOCUMENTS

| | | |
|---|---|---|
| 0217713 | 4/1987 | European Pat. Off. . |
| 0241236 | 10/1987 | European Pat. Off. . |
| 64-29156 | 8/1990 | European Pat. Off. . |
| 0495316 | 7/1992 | European Pat. Off. . |
| 0527468 | 2/1993 | European Pat. Off. . |

OTHER PUBLICATIONS

*CMOS Analogue Circuit Design*, by P.E. Allen, pp. 234–239.

*Primary Examiner*—Stephen Chin
*Assistant Examiner*—Hai H. Phan
*Attorney, Agent, or Firm*—Burns, Doane, Swecker & Mathis, L.L.P.

[57] ABSTRACT

A signal receiving and signal processing unit connected to one or several conductors is adapted to transmit information-carrying signals in the form of voltage pulses. A conductor is connected to a transistor belonging to a signal receiving circuit, to have an effect upon a current by using variations in the voltage pulses and the voltage value of a pulse. The current is in the form of pulses passing through the transistor. The current is generated by the voltage pulse variations and a voltage level, and the current is adapted to an information-carrying form in a signal processing circuit. The transistor belonging to the signal receiving circuit is coordinated with at least one other transistor to form a current mirror. The ability of the signal receiving circuit to receive, detect, and process the signals is adjustable through a current generating circuit such that an increasing current value provides detection of a voltage pulse at an increased transfer rate and vice versa.

6 Claims, 1 Drawing Sheet

SIGNAL RECEIVING AND SIGNAL PROCESSING UNIT

BACKGROUND

The present invention relates to a signal receiving and signal processing unit. The invention relates more specifically to a signal receiving circuit and a signal processing circuit where the character of the signals are in the form of pulse-shaped voltage variations having a selected high repetition frequency, such as from the megabit per second (Mb/s) area up to the gigabit per second (Gb/s) area, more than 1 Mb/s and preferably more than 100 Mb/s.

The voltage variations are controlled to represent a digital information-carrying signal, with an internal structure, by a transmitting circuit. The digital signal is distorted by, among other things, the signal transferring conductor. The receiving circuit is intended to be able to detect and receive a thus distorted digital signal.

Units of this kind are used to adapt received (distorted) signals into transmitted signals having an internal signal structure. A received signal which presents a somewhat erroneous voltage level and/or is not adapted to a certain common mode (CM) area is to be adapted, by the signal processing unit, to an internal signal structure more suitable to the requirements that are needed in an exchange of signals.

Such signal receiving and signal processing units are connected to a conductor adapted to transmit information-carrying signals in the form of voltage pulses. The conductor is connected to a transistor, belonging to a signal receiving circuit, to have an effect upon a current by using variations in the voltage pulses and the voltage value of a pulse. The current is in the form of pulses that are passing through the transistor, and the current is generated by voltage pulse variations and a voltage level. In the signal processing circuit, the current is adapted to an information-carrying form better suited to the internal circuit structure than the received signal was.

Signal receiving and signal processing units of this kind have been useful to evaluate the information content in voltage pulses having pulse rates in the range of up to 200 Mb/s. These units have been adapted to be able to detect pulse-shaped voltage variations appearing on a single conductor (single-ended signalling), or appearing on or between two conductors (differential signalling). The following description will, in the interest of simplicity, be limited to the application where differential signalling is used, even though the invention is applicable to both types of signalling systems.

It is obvious to one skilled in the art what measures are to be taken to keep the voltage potential of one conductor at a constant level, which is required at single ended signalling. This will, nevertheless, be described in the following.

It is known to use various techniques to manufacture these signal receiving and signal processing units to thereby achieve various working conditions. Both CMOS technology and bipolar technology have been used to manufacture signal receiving units and signal processing units of the aforementioned kind. The following description will mainly describe CMOS technology, as the differences in function due to the use of bipolar technology are of minor significance and are obvious to one skilled in the art. It is further obvious to one skilled in the art what changes are required to adapt CMOS technology and/or bipolar technology to other known technologies.

When manufacturing units of this kind there are, among other things, the following criteria that are of significant importance.

A. The span and voltage values of the CM area pertaining to the signal receiving circuit and the signal processing circuit. (The CM area is the voltage area that the received voltage pulses are to be within to be detected by the signal receiving circuit, in a differential transmitting system.)

B. The limiting value of the repetition frequency, which is the highest frequency of the voltage variations on the conductors that can be detected and distinguished from each other by the signal receiving circuit and thereafter processed by the signal processing circuit.

C. The voltage variations or amplitude variations that are required to detect the signals, where small amplitudes can be accepted at low rates, but at higher rates greater amplitudes are required.

It is known to connect the information-carrying signals that appear on the conductors to the gate connections belonging to PMOS transistors, where the CM area comprises the voltage area from somewhat above half of the supply voltage (Vcc) down to zero potential. The use of a PMOS transistor and a post-connected current mirror or a post-connected cascode connection likewise provides a downward extending CM area, to somewhat below zero potential (approximately –0.7 V).

It is also known that PMOS transistors present a lower limiting value, of the repetition frequency (up to 200 Mb/s) than that provided by NMOS transistors. Using NMOS transistors instead of PMOS transistors would provide a CM area extending from the supply voltage down to somewhat below half the supply voltage. This is not acceptable since, in a practical application, the CM area has to be at least within the area that is provided with PMOS transistors and a post-connected current mirror or a cascode connection.

When constructing signal receiving and signal processing units of aforementioned kind, it is known to use and coordinate two transistors within the signal processing circuit so that a current passing through a first transistor is mirrored to be the same through a second transistor, and the drain-source voltage of the second transistor can be permitted to vary relatively greatly in relation to the current variation through the first transistor.

It is also previously known to make the current through the second transistor further independent of the drain-source voltage (a high impedance current generator) by means of a cascode connection. Other current mirror connections are also known, such as a connection having three transistors known as the "Wilson Current Mirror". Reference is made to the publication, P. E. Allen, *CMOS Analogue Circuit Design* (ISBN 0-03-006587-9) to provide a further and more detailed understanding of the earlier known prior art.

CMOS technology uses PMOS transistors and NMOS transistors, and in the following, transistors will be described with an "N" or a "P" before their reference numerals to indicate whether the transistor is an NMOS or a PMOS transistor, respectively. The expression "current mirror" will in the following description and claims be understood to cover every kind of current minor regardless of whether two, three, or more transistors are used. The Wilson circuit and the cascode circuit represent current mirror connections that provide better attributes when connected as current generators.

While the following description uses the term "NMOS transistors", this term should be considered to include bipolar NPN transistors and equivalent transistors of other technologies. Bipolar PNP transistors and the like are also to be included in the term "PMOS transistors".

It is further known that selected current values through a signal receiving transistor are, within a certain area, in direct proportion to the ability to receive, detect, and process signals of a higher rate. The upper limit of the current value is set to where the transistor leaves or goes out of the amplifying mode because of the current density within the transistor.

The present invention can further be regarded as a further development of the signal receiving and signal processing unit that is described in more detail in Swedish Patent Application No. 9400593-1, filed Feb.21, 1994, and corresponding U.S. Patent Application No. 08/391,005, filed Feb. 21, 1995, which is now U.S. Pat. No. 5,568,082 that is incorporated here by reference.

SUMMARY

Considering the prior art, as described above, and with respect to the trend within this technical field, there is a need for a signal receiving unit where the transistor or transistors belonging to the signal receiving circuit are supplied through a specific current generating circuit. The value of the current through the transistor should be adjustable in order to be able to change the maximum rate so that the signal receiving circuit has the ability to receive, detect, and process at a higher transfer rate.

There is also a need to be able to select a current value in several steps so that one of several fixed current values can be selected along with one of several available maximum transfer rates. When the current values are adjustable in steps, each and every one of these steps should be formed through the activation of one or several devices belonging to a current generating circuit, where every device is generating a partial current. The partial-current generating devices should be activated and deactivated by means of a control circuit in order to generate digital and/or analog signals.

There is further a need for the partial-current generating devices to be activated and deactivated by means of a controlled transistor where the voltage value of the gate terminal of a control transistor is determined by the state of two series-connected transistors, one being a PMOS transistor and the other being an NMOS transistor. The gate terminals of the series-connected transistors should be mutually connected and affected by the output signal of the control circuit. A current-generating circuit should provide an analog adjustment of the current value and should be connected or disconnected through a voltage pulse appearing on a conductor.

According to the present invention, each and every one of one or several transistors belonging to a signal receiving circuit is coordinated with at least one other transistor to mutually form a current mirror. The ability of the signal receiving circuit to receive, detect, and process signals is adjustable through a current-generating circuit such that an increasing current value provides an increased maximum rate and vice versa.

In one embodiment, the current values are adjustable in steps that are formed by the activation of one or several devices belonging to a current-generating circuit, where every device is generating a partial current. The partial-current generating devices are activated and deactivated by a control circuit that can be activated by digital signals. Partial-current generating devices are activated and deactivated by a controlled transistor. The voltage value of the gate terminal of the control transistor is determined by the state of two series-connected transistors, one being a PMOS transistor and the other being an NMOS transistor, where the gate terminals of the series-connected transistors are mutually connected and affected by a digital output signal of the control circuit.

According to the present invention, the current can be adjusted in an analog way to select a maximum rate from a continuous rate scale of the signal to detect and process the information-carrying signals. The current-generating circuit can be connected or disconnected through a logical signal, such as a voltage pulse, appearing on a conductor.

The signal receiving and signal processing unit, according to the present invention, adjusts the ability of the signal receiving circuit to receive, detect, and process signals with adapted current values. The current is adjustable such that an increasing current value provides an increased maximum transfer rate, and the signal receiving and signal processing can be performed with a high separation ability, and vice versa.

BRIEF DESCRIPTION OF THE DRAWINGS

Preferred embodiments of a signal receiving and signal processing unit in accordance with the present invention will now be described in more detail with reference to the accompanying drawings, in which.

DETAILED DESCRIPTION

Figure 1:
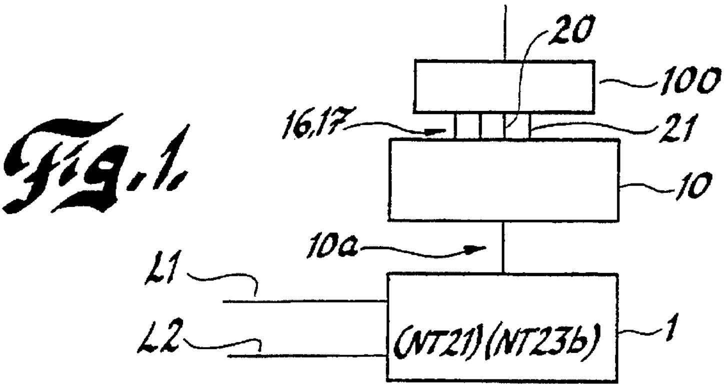
FIG. 1 illustrates a general block diagram of a unit according to the invention.

A unit according to the invention is illustrated by the block diagram in FIG. 1, which shows a signal receiving and signal processing unit 1 and a current-generating circuit 10. The current-generating circuit 10 can be affected by a control circuit 100 in order to generate one of several available fixed current values. The circuit 10 is also able to generate a current value according to an analog voltage value through the control circuit 100. A current value that has been selected in an analog way can be added to one or several of the fixed current values.

Figure 2:
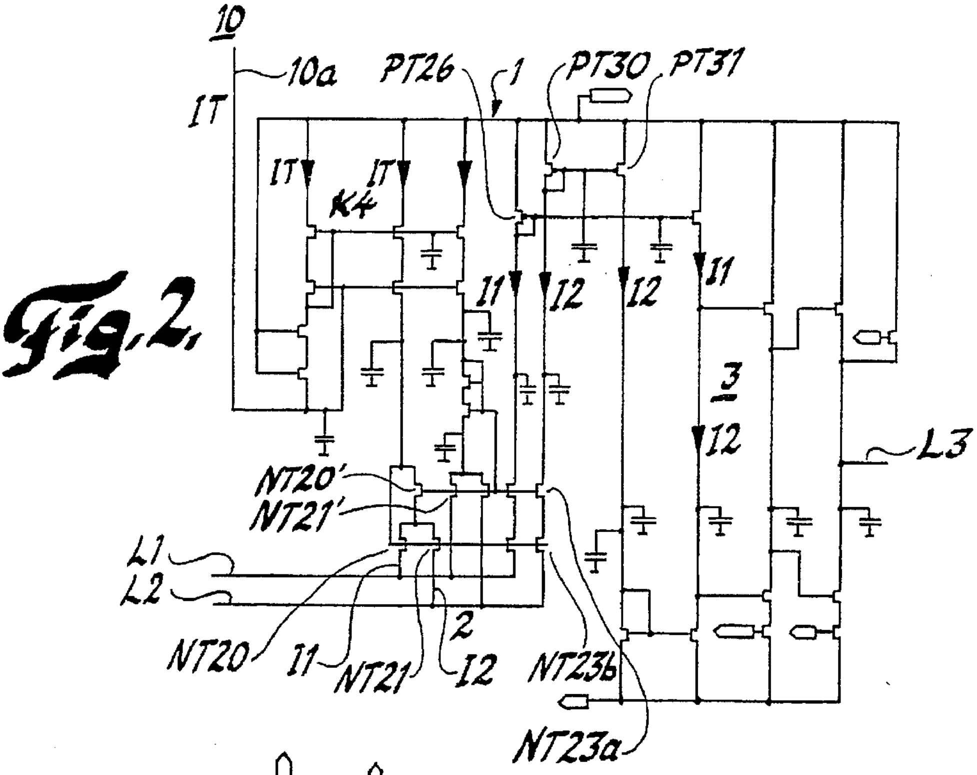
FIG. 2 illustrates a wiring diagram of a signal receiving and signal processing unit.

Reference is made to the description of the above-cited Swedish and U.S. Patent Applications for a more profound understanding of the signal receiving and signal processing unit 1, according to FIGS. 1 and 2. The same numbers that have been given to details in FIGS. 5 and 6 in the Swedish and U.S. Applications have been given to details described in FIG. 2 in this application to further clarify the present invention.

The signal receiving and signal processing unit 1 is thus connected to one or several conductors L1, L2, respectively adapted to transmit information-carrying signals in the form of voltage pulses. The conductor L1 is connected to a transistor NT20 belonging to a signal receiving circuit 2. A transistor NT21 is provided for the conductor L2.

The variations in the voltage pulses on the conductors L1, L2 and the voltage value of a pulse have an effect upon both a pulse-shaped current I1 passing through the transistor NT20 and a pulse-shaped current I2 passing through the transistor NT21. A signal processing circuit 3 adapts a current signal into an information-carrying form on the conductor L3.

The transistor NT21 belonging to the signal receiving circuit 2 is coordinated with at least one other transistor NT23b to mutually form a current mirror. The total current IT passing through each transistor is adjustable through the current-generating circuit 10 connected to the conductor 10*a*. The ability of the signal receiving circuit to receive, detect, and process the signals is thus adjustable such that an increasing current value provides an improved and increased sensitivity, improving the reliability of reception and increasing the rate of processing, and vice versa.

Figure 3:
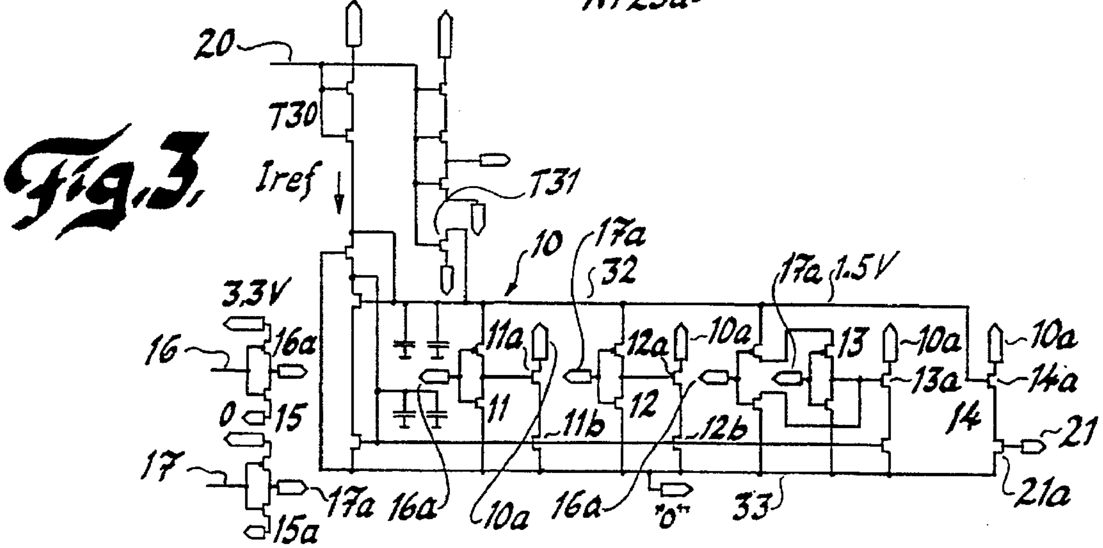
FIG. 3 illustrates a wiring diagram of a current generating circuit.

The total current value IT is adjustable in steps where each and every step is formed by the activation of one or several devices 11, 12, 13 belonging to the current-generating circuit 10 in FIG. 3. The devices 11, 12, 13 each generate a partial current. The partial-current generating devices 11, 12, 13 are activated and deactivated by voltage pulses that appear on conductors 16*a*, 17*a*, respectively. The voltage pulses are activated by control circuits 15, 15*a*.

A conductor 16*a* belonging to the control circuit 15 is connected to the first and third partial-current generating devices 11, 13, while a conductor 17*a* belonging to the control circuit 15*a* is connected to the second and third partial-current generating devices 12, 13. A low signal is generated on the outgoing conductors 16*a* or 17*a* in response to a high signal from the control circuit 100 on conductor 16 or 17.

A control circuit 100 is arranged to select and activate the signals appearing on the conductors 16, 17, 21, in order to thereby select a current value or combination of current values corresponding to a desired highest bit rate. The control circuit 100 can also generate an analog signal on the conductor 20 to activate or deactivate the devices 11, 12, 13 or 14.

Only the device 11 is described below since the illustrated partial-current generating devices 11, 12, 13 in FIG. 3 are substantially the same. The first partial-current generating device 11 can be activated to supply a current and deactivated by means of a controlled NMOS transistor 11*a*. The voltage value of the gate terminal of the control transistor is determined by the state of two series-connected transistors, one being a PMOS transistor and the other being an NMOS transistor. The gate terminals of the series-connected transistors are mutually connected and affected by the output signal of the control circuit 100 and a signal that is connected through the control circuit on the conductor 16*a*. A low logical level appears on conductor 16*a* if there is a high logical level on conductor 16, and the device 11 is only activated if there simultaneously appears a low logical value on the conductor 17.

The second device 12 is activated if a low logical value appears on conductor 16 and a high logical value appears on conductor 17. The third device 13 is activated at a high logical level on conductor 16 and conductor 17. A previously determined current value through the device 11 is determined by the value of the transistor 11*b*; the current value through the device 12 is determined by the value of the transistor 12*b*; and so on.

One of several available fixed current values (0; I11; I12; and I11+I12 +I13) can be selected through the circuit 10 at the dimensioning of the devices 11, 12, 13. An addition can be made to each and every one of these current values by a further analog current value I14 which is proportional to the value of the voltage appearing on conductor 21. This is useful for increasing the current value above the fixed values that are provided by the devices 11, 12, and/or 13.

All devices 11, 12,. 13 can be connected or disconnected through a high or low logical value, generated by the control circuit 100, on a conductor 20. The current "Iref" is cut off by the transistor connection T30, and the conductor 32 is connected to the reference voltage (zero level) on conductor 33 through a transistor T31. The devices 11, 12, 13, 14 are blocked at a high level or voltage on conductor 20.

The current value to the signal receiving circuit can be adjusted in an analog way using an adjustable voltage value on the conductor 21, even when the devices 11, 12, 13 are disconnected, by activating the transistor 14*a* (activated by a cascode reference voltage) within the circuit 14 and permitting the transistor 21*a* to adjust the current value according to the current voltage value on the conductor 21. The current value IT can be selected to be much higher then "Iref" through the dimensioning of the transistor 11*b* by using a number of transistors connected in parallel.

It will be understood that the invention is not restricted to the illustrated exemplifying embodiments thereof and that modifications can be made within the scope of the following claims.

What is claimed is:

1. A signal receiving and signal processing unit connected to at least one conductor adapted to transmit information-carrying signals in the form of voltage pulses, the unit comprising:

a signal receiving circuit including a transistor connected to the conductor to have an effect upon a current by using variations in the voltage pulses and a voltage value of a pulse, where the current is in the form of pulses that are passing through the transistor and the current is generated by the voltage pulse variations and a voltage level; and a signal processing circuit for adapting the current to information carrying form;

wherein the transistor is connected with at least one other transistor to form a current mirror, and the ability of the signal receiving circuit to receive, detect, and process the signals is adjustable through a current generating circuit in a way so that an increasing current value provides a detection of a voltage pulse at an increased rate and vice versa.

2. The unit of claim 1, wherein the current value is adjustable in steps that are selected by activating one or several devices belonging to the current generating circuit, where each device generates a partial current.

3. The unit of claim 2, wherein the devices are activated and deactivated by a control circuit that is activated by digital signals.

4. The unit of claim 2, wherein the devices belonging to the current generating circuit are each activated and deactivated by a controlled transistor; a voltage value of a gate terminal of the controlled transistor is determined by a state of two series-connected transistors, one being a PMOS transistor and the other being an NMOS transistor; the gate terminals of the series-connected transistors are mutually connected and affected by an output signal of a control circuit.

5. The unit of claim 1, wherein the current value is at least partly adjustable in an analog way.

6. The unit of claim 1, wherein the current generating circuit is connected and disconnected in response to selected logical levels appearing on a conductor.

* * * * *